United States Patent
Morita

(10) Patent No.: US 7,221,197 B2
(45) Date of Patent: May 22, 2007

(54) DRIVER CIRCUIT OF DISPLAY DEVICE

(75) Inventor: Tetsuo Morita, Kounosu (JP)

(73) Assignee: Toshiba Matsushita Display Technology Co., Ltd., Tokyo (JP)

( * ) Notice: Subject to any disclaimer, the term of this patent is extended or adjusted under 35 U.S.C. 154(b) by 16 days.

(21) Appl. No.: 11/178,466

(22) Filed: Jul. 12, 2005

(65) Prior Publication Data

US 2006/0038766 A1   Feb. 23, 2006

(30) Foreign Application Priority Data

Aug. 23, 2004  (JP) ............................. 2004-242535

(51) Int. Cl.
*H03B 1/00*   (2006.01)
*G09G 3/36*   (2006.01)

(52) U.S. Cl. .......................... 327/112; 345/98
(58) Field of Classification Search ................ 327/309, 327/319, 321, 333, 112; 326/80–81, 62–63; 345/98
See application file for complete search history.

(56) References Cited

U.S. PATENT DOCUMENTS 5,166,960 A * 11/1992 Da Costa ..................... 377/70
5,206,634 A * 4/1993 Matsumoto et al. ........... 345/99
5,222,082 A    6/1993 Plus ............................. 377/79
5,414,443 A * 5/1995 Kanatani et al. .............. 345/95
6,928,135 B2 * 8/2005 Sasaki et al. ................. 377/64
7,098,882 B2 * 8/2006 Kitani et al. .................. 345/92
2003/0174106 A1* 9/2003 Tanada et al. ................ 345/83

FOREIGN PATENT DOCUMENTS

JP    2003-344873    12/2003

* cited by examiner

*Primary Examiner*—My-Trang Nu Ton
(74) *Attorney, Agent, or Firm*—Oblon, Spivak, McClelland, Maier & Neustadt, P.C.

(57) ABSTRACT

In a driver circuit of a display device, an electric potential difference between high-level power supply voltage VDD and low-level power supply voltage VSS2 in shift registers and buffers is set smaller than an electric potential difference between high-level voltage VDD and low-level voltage VSS of enable signals OE in order to prevent increase in voltage stress on each transistor and concurrently to make larger an electric potential difference between high-level voltage and low-level voltage of output signals.

4 Claims, 7 Drawing Sheets

DRIVER CIRCUIT OF DISPLAY DEVICE

CROSS-REFERENCE TO RELATED APPLICATION

This application is based upon and claims the benefit of priority from Japanese Patent Application No. 2004-242535 filed on Aug. 23, 2004; the entire contents of which are incorporated herein by reference.

BACKGROUND OF THE INVENTION

1. Field of the Invention

The present invention relates to a driver circuit for driving scan lines or signal lines in a display device.

2. Description of the Related Art

Plane display devices, typified by liquid crystal display devices, feature thinness, light weight, and low power consumption, and accordingly are in use for displays of various types of electric appliances. Out of the plane display devices, active-matrix liquid crystal display devices with a transistor arranged in each pixel have been increasingly in use for note personal computers and portable information terminal devices. Recently, a technique has been established, which forms polysilicon thin film transistors (p-Si TFTs) with high electron mobility by means of a process to be performed at a temperature relatively lower than that which is applied in order to form amorphous silicon thin film transistors, which have been in use for conventional liquid crystal display devices. This establishment has made it possible to fabricate transistors in a smaller size, which are in use for liquid crystal display devices. This has made it possible to integrally form a pixel part and driver circuits on a transparent glass substrate through a single manufacturing process: the pixel part is configured by arranging a transistor at an intersection between each of a plurality of scan lines and its corresponding one of a plurality of signal lines, and the driver circuits respectively drive a group of scan lines and a group of signal lines.

In addition, as disclosed in Japanese Patent Laid-open No. 2003-344873, development has been in progress for a bootstrap circuit for the purpose of setting electric potential for output signals from a driver circuit at a sufficient level.

An electric potential difference between the high-level voltage and the low-level voltage of output signals from a driver circuit is used in order for the output signals from the driver circuit to control the writing of video signals into each pixel. For this reason, from the viewpoint of enabling the writing to be stable, it is desirable that the electric potential difference be as large as possible. However, a larger electric potential difference between the high-level voltage and the low-level voltage means a higher voltage stress being on the transistors. This is likely to reduce reliability in operation of each of the transistors that constitute the driver circuits. Furthermore, the larger electric potential difference leads driving the driver circuits at a higher voltage. This brings about a problem of requiring larger power consumption.

SUMMARY OF THE INVENTION

An object of the present invention is to prevent voltage stress on each transistor from increasing, to concurrently make it possible to set larger an electric potential difference between the high-level voltage and the low-level voltage of output signals.

A driver circuit for a display device according to the present invention is characterized by including shift registers and buffers. Each of the shift registers shifts the phase of input signals to be inputted thereinto, and outputs the signals with the shifted phase. Each of the buffers amplifies the amplitude of the output signals from the shift registers corresponding to the buffer by use of enable signals, and outputs the signals with the amplified amplitude to a scan line or a signal line. The driver circuit is characterized in that an electric potential difference between the high-level voltage and the low-level voltage of the enable signals is used as an electric potential difference with which to drive the scan lines or the signal lines, and in that an electric potential difference between the high-level power supply voltage and the low-level power supply voltage respectively in the shift registers and the buffers is set smaller than the electric potential difference between the high-level voltage and the low-level voltage of the enable signals.

In the present invention, an electric potential difference between the high-level power supply voltage and the low-level power supply voltage respectively for the shift registers and the buffers are set smaller than the electric potential difference between the high-level voltage and the low-level voltage of the enable signals. Thereby, the electric potential difference between the high-level voltage and the low-level voltage is made larger with regard to output signals from each of the buffers, which are amplified by use of the enable signals. On the other hand, the shift registers and the buffers are caused to operate by use of the high-level power supply voltage and the low-level power supply voltage, between which an electric potential difference is small. These help reduce voltage stress on each transistor. This makes it possible to set larger an electric potential difference between the high-level voltage and the low-level voltage of output signals from each of the buffers, thus enabling video signals to be written into the pixel corresponding to the buffer stably. Moreover, this makes it possible to reduce voltage stress on each transistor inside the shift registers and the buffers, thus achieving highly reliable operations. Additionally, this enables the driver circuit to operate at a lower voltage, thus enabling power consumption to be reduced.

DESCRIPTION OF THE EMBODIMENT

Figure 1:
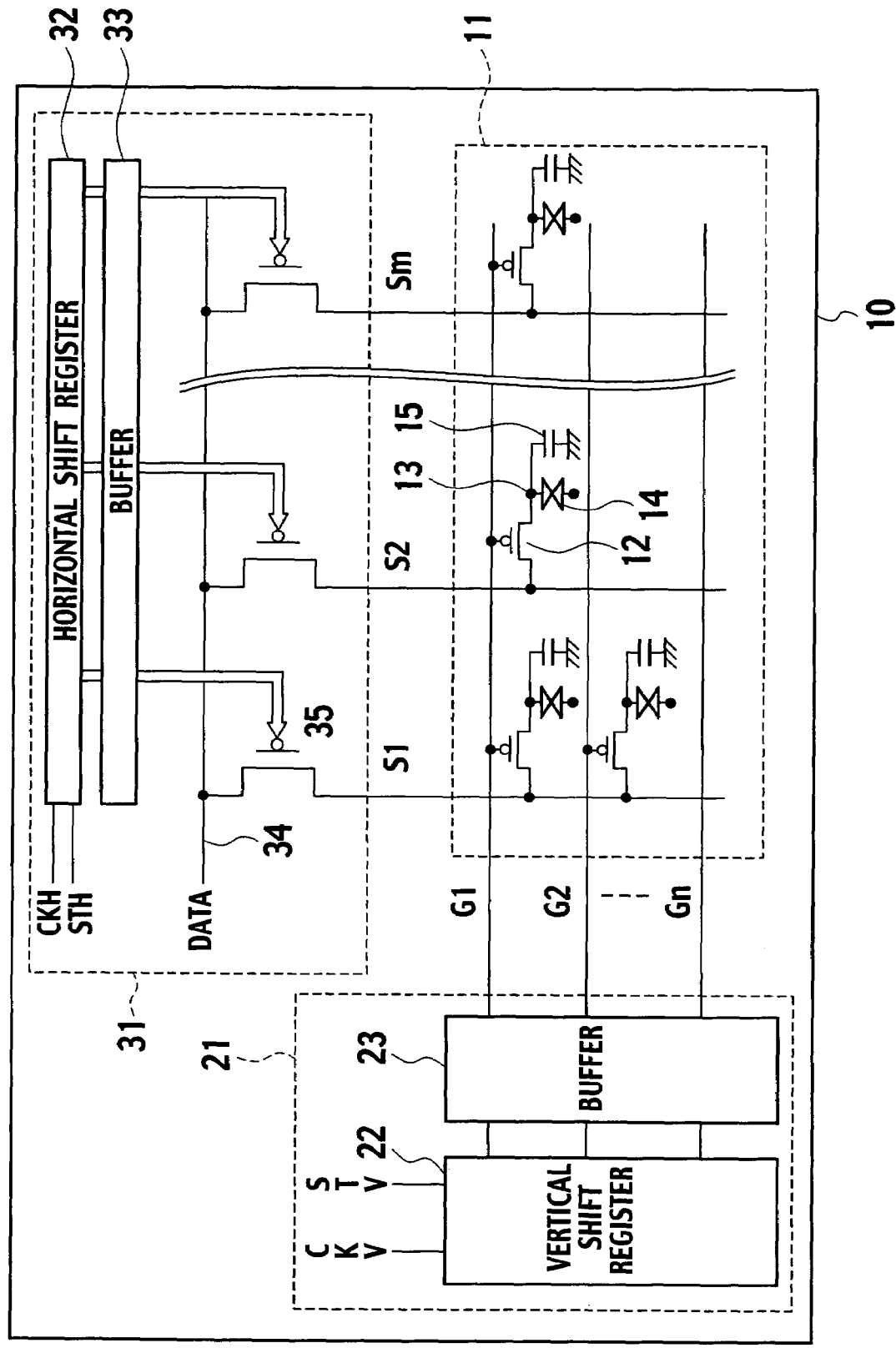
FIG. 1 shows a circuit diagram of a display device according to an embodiment.

As shown in the circuit diagram of FIG. 1, a display device according to the embodiment includes a pixel part 11, a scan line driver circuit 21 and a signal line driver circuit 31 on the surface of a transparent glass substrate 10. In this case, descriptions will be provided for a configuration of the display device, giving an example of active-matrix liquid crystal display devices.

In the pixel part 11, a plurality of scan lines G1, G2, ..., Gn (hereinafter generically termed as "G") and a plurality of signal lines S1, S2, ..., Sm (hereinafter generically termed as "S") are arranged in a way that the plurality of scan lines and the plurality of signal lines intersect each other. A switching element 12, a pixel electrode 13, a liquid crystal capacitor 14 and an auxiliary capacitor 15 are arranged at each intersection. As an example, a polysilicon thin film transistor is used for the switching element 12.

The scan line driver circuit 21 includes a vertical shift register 22 and a buffer 23. The vertical shift register 22 is formed of a plurality of shift registers electrically connected to one another longitudinally. The buffer is connected to the output stage of the vertical shift register 22. The signal line driver circuit 31 includes a horizontal shift register 32, a buffer 33, a video signal line 34 and a plurality of analog switches 35. The horizontal shift register 32 is formed of a plurality of shift registers electrically connected to one another longitudinally. The buffer 33 is connected to the output stage of the horizontal shift register 32. The video signal line 34 is one through which video signals are supplied. The plurality of analog switches 35 are ones through which the video signal line 34 is connected with each of the signal lines S.

Both start pulse signals (STP) and clock signals (CK) are inputted into the vertical shift register 22 and the horizontal shift register 33. In this case, the start pulse signals to be inputted into the vertical shift register 22 are termed as STV, and the start pulse signals to be inputted into the horizontal shift register 32 are termed as STH. In addition, the clock signals to be inputted into the vertical shift register 22 are termed as CKV, and the clock signals to be inputted into the horizontal shift register 32 are termed as CKH.

Each of the vertical shift register 22 and the horizontal shift register 32 shifts the phase of start pulse signals STP to be inputted thereinto, and outputs the signals with the shifted phase. In this respect, the scan line driver circuit 21 outputs vertical scan pulses from each of the shift registers therein to the respective scan lines G corresponding to the shift register while shifting phases of the vertical scan pulses one by one. The signal line driver circuit 31 outputs horizontal scan pulses from each of the shift registers therein to its corresponding one of the analog switches 35 provided to the respective signal lines S while shifting phases of the horizontal scan pulses one by one, thereby turning the analog switches 35 on. Accordingly, the signal line driver circuit 31 causes video signals, which have been supplied to the signal line driver circuit 31 through the video signal line 34 from the outside, to be outputted in each of the signal lines S respectively through the analog switches 35.

The width W and the length L of the channel of each of the transistors in the buffers 23 and 24 are made larger than the width and the length of the channel of each of the transistors in the vertical shift register 22 and the horizontal shift register 32 in order that pulses capable of frilly driving the scan lines G and the analog switches 35 may be outputted. In addition, it is desirable that the driver circuits are respectively configured of only either a set of pMOS transistors or a set of nMOS transistors in order to cut back the manufacturing process and to enable costs to be reduced.

Figure 2:
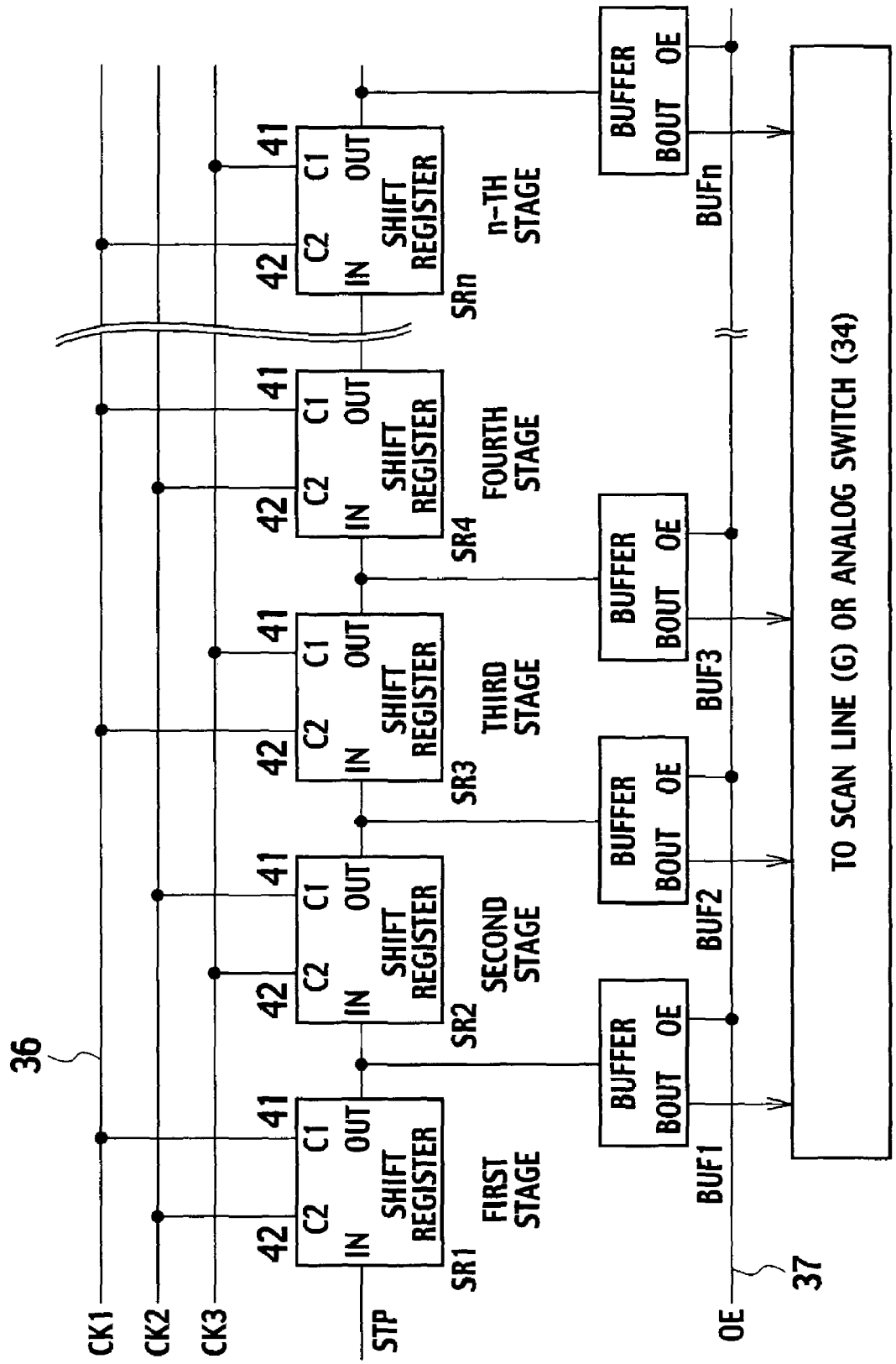
FIG. 2 shows a circuit diagram of a driver circuit in the display device.

FIG. 2 shows a circuit diagram of the driver circuit. Basically, a configuration of the scan line driver circuit 21 is similar to that of the signal line driver circuit 31. It is a matter of course that any one of the two driver circuits may be configured in a manner as shown in FIG. 2. Each of the driver circuits is configured to include the plurality of shift registers SR1, SR2, ..., SRn (hereinafter genetically termed as SR), a clock line 36, a plurality of buffers BUF1, BUF2, ..., BUFn, and an output line 37. The plurality of shift registers SR are electrically connected to one another longitudinally. The clock line 36 is one through which any two of three clock signals CK1, CK2 and CK3 with their phases shifted one by one are inputted to each of the shift registers SR. The plurality of buffers are connected respectively to the output stages of the shift registers SR1, SR2, ..., SRn. The output line 37 is one through which enable signals OE (output enable) are supplied to each of the buffers BUF. The clock signals CK1 to CK3 constitutes vertical clock signals CKV in the vertical shift register 22, and constitutes horizontal clock signals CKH in the horizontal shift register 32.

The shift registers SR1, SR2, ..., and SRn correspond respectively to a first stage, a second stage, ..., and an nth stage. Each of the shift registers SR includes a first clock terminal 41 and a second clock terminal 42. In the shift register SR1, for example, a first clock signal CK1 is inputted into the first clock terminal 41, and a second clock signal CK2 is inputted into the second clock terminal 42. In the shift register SR2, a second clock signal CK2 is inputted into the first clock terminal 41, and a third clock signal CK3 is inputted into the second clock terminal 42.

Each of the shift registers SR shifts the phase of input signals IN to be inputted thereinto in a way that the phase is synchronized to two of the three clock signals, and outputs the signals respectively with the phases thus shifted as output signals OUT. Start pulse signals STP are inputted, as the input signals IN, into a shift register SR1 at a first stage. Output signals OUT from a shift register SR at any stage coming at or after the second stage are inputted into a shift register at the ensuing stage. Each of the buffers BUF amplifies the amplitude of output signals OUT, and outputs the signals with the amplified amplitude as output signals BOUT.

The scan line driver circuit 21 outputs output signals BOUT from each of the buffers BUF, as vertical scan pulses, to the scan lines G corresponding to the buffer. The signal line driver circuit 31 outputs output signals BOUT from each of the buffers BUF, as horizontal scan pulses, to the control electrode of the analog switch 35 corresponding to the buffer.

Figure 3:
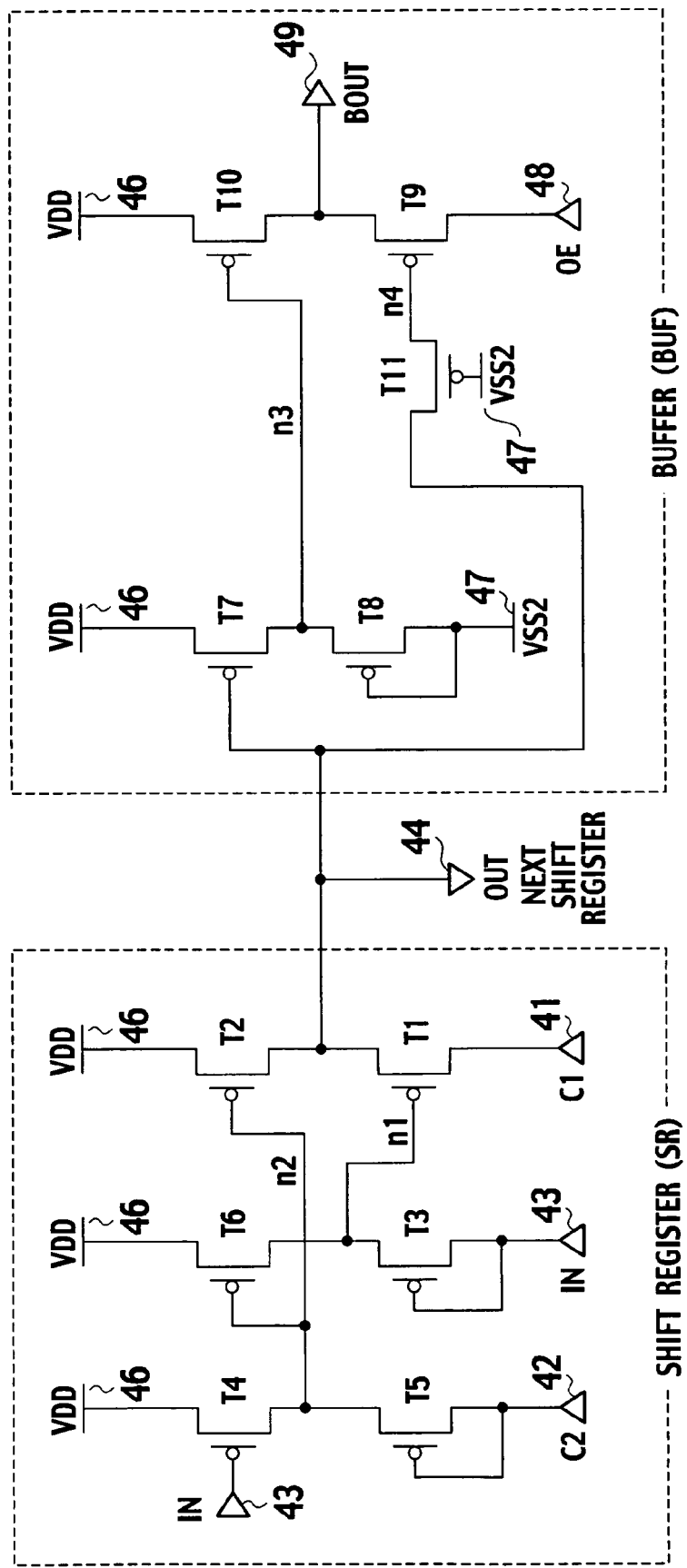
FIG. 3 shows a circuit diagram of a shift register and a buffer in the driver circuit.

FIG. 3 shows a circuit diagram of the configurations respectively of one of the shift registers SR and one of the buffers BUF. Input signals IN are inputted into the input terminal 43. In addition, any two of the three clock signals CK1, CK2 and CK3 with their phases shifted one by one are inputted to clock terminals. As an example, it is supposed in FIG. 3 that a first clock signal CK1 is inputted into the first clock terminal 41, and that a second clock signal CK2 is inputted into the second clock terminal 42. As an example, it is also supposed that all of the transistors included in the shift registers SR and the buffers BUF are pMOS transistors.

Each of the shift registers SR is configured to include an output circuit, an input circuit and a reset circuit. The output circuit is configured of a first transistor T1 and a second transistor T2. The drain and the source of the first transistor T1 are electrically connected respectively to the first clock terminal 41 and the output terminal 44. The source and the drain of the second transistor T2 are electrically connected respectively to a power supply electrode 46 and the output terminal 44. A first clock signal CK1 is inputted into the first clock terminal 41, and high-level power supply voltage VDD is supplied to the power supply electrode 46. This output circuit outputs the first clock signal CK1 to the output terminal 44 in a case where the first transistor T1 is on and the second transistor T2 is off. This output circuit outputs the power supply voltage VDD to the output terminal 44 in a case where the first transistor T1 is off and the second transistor T2 is on. Here, a conductive path of the first transistor T1 to the control electrode is denominated by a node n1, and a conductive path of the second transistor T2 to the control electrode is denominated by a node n2.

The input circuit is configured of a third transistor T3 and a fourth transistor T4. The drain and the gate of the third transistor T3 are electrically connected to the input terminal 43, and the source of the third transistor T3 is electrically connected to the control electrode of the first transistor T1. In addition, the source, the drain and the gate of the fourth transistor T4 are electrically connected respectively to the power supply electrode 46, the control electrode of the second transistor T2 and the input terminal 43. The input circuit receives input signals IN through the input terminal 43.

The reset circuit is configured of a fifth transistor T5 and a sixth transistor T6. The drain and the gate of the fifth transistor T5 are electrically connected to the second clock terminal 42, and the source of the fifth transistor T5 is electrically connected to the control electrode of the second transistor T2. In addition, the drain of the sixth transistor T6 is electrically connected to the control electrode of the first transistor T1, and the gate of the sixth transistor T6 is electrically connected to the drain of the fourth transistor T4 and the control electrode of the second transistor T2, and the source of the sixth transistor T6 is electrically connected to the power supply electrode 46. A second clock signal CK2 is inputted into the second clock terminal 42. This reset circuit turns on one of the first and the second transistors T1 and T2, and turns off the other of the first and second transistors T1 and T2.

Each of the buffers BUF includes an inverter, an output circuit, an eleventh transistor T11. The inverter is configured of a seventh transistor T7 and an eighth transistor T8. The output circuit is configured of a ninth transistor T9 and a tenth transistor T10. The eleventh transistor T11 is connected to the middle between the output terminal 44 of the shift register corresponding to the buffer and the control electrode of the ninth transistor T9.

More specifically, the gate and the source of the seventh transistor T7 are connected respectively to the output terminal 44 of the shift register and the power supply electrode 46 to which the power supply voltage VDD is supplied. The gate and the drain of the eighth transistor T8 is connected to a power supply electrode 47 to which low-level power supply voltage VSS2 is supplied, and the source of the eighth transistor T8 is connected to the drain of the seventh transistor T7.

The ninth transistor T9 includes a conductive path between an enable terminal 48 and an out terminal 49: the enable terminal 48 is one to which enable signals GE are inputted, and the output terminal 49 is one from which amplified signals are outputted. The tenth transistor T10 includes a conductive path between the output terminal 49 and the power supply voltage VDD. More specifically, the drain and the source of the ninth transistor T9 are connected respectively to the enable terminal 48 and the output terminal 49, and the gate of the ninth transistor T9 is connected to the output terminal 44 of the shift register corresponding to the buffer through the eleventh transistor T11. The gate of this eleventh transistor T11 is supplied with the low-level power supply voltage VSS2. The drain and the source of the tenth transistor T10 are connected respectively to the output terminal 49 and the power supply electrode 46 to which the power supply voltage VDD is supplied, and the gate of the tenth transistor T10 is connected to a connecting point between the seventh transistor T7 and the eighth transistor T8. Here, a conductive path of the tenth transistor T10 to the control electrode is denominated by a node n3, and a conductive path of the ninth transistor T9 to the control electrode is denominated by a node n4.

This driver circuit is characterized in that the electric potential difference between the high-level power supply voltage and the low-level power supply voltage respectively for the shift registers SR and the buffers BUF are set smaller than the electric potential difference between the high-level voltage and the low-level voltage for enable signals OE.

More specifically, the high-level power supply voltage VDD is caused to be maintained at a constant level, and concurrently the low-level power supply voltage VSS2 used in the shift registers SR and the buffers BUF is caused to have an electric potential higher than the low-level power supply voltage VSS of enable signals OE. These will be described in detail with reference to FIGS. 3 and 4.

Figure 4:
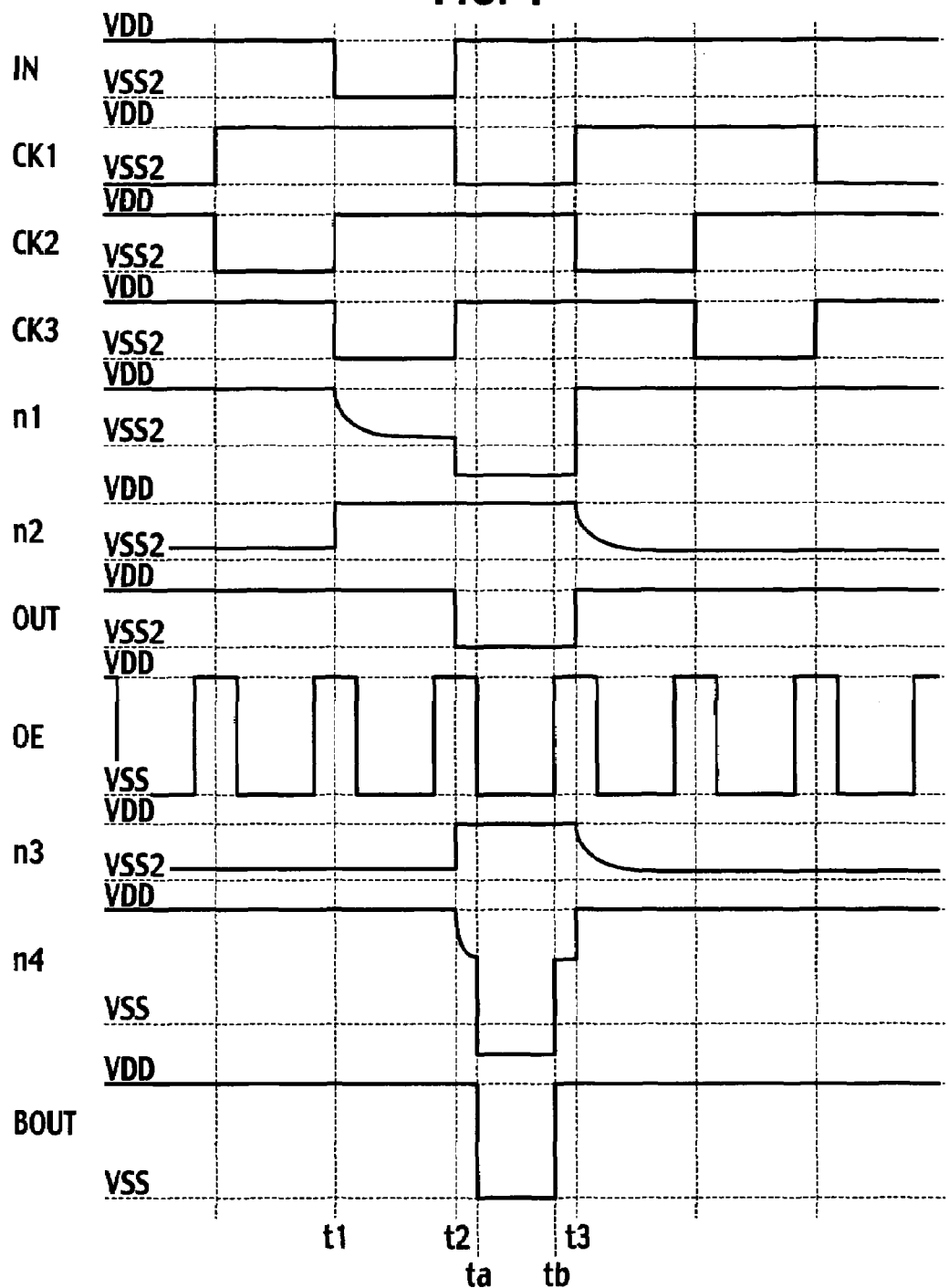
FIG. 4 shows a timing chart of the driver circuit operations.

FIG. 4 is a timing chart showing a mutual relationship among input signals IN into the shift register SR1, clock signals CK1 to CK3, enable signals OE, signals at the nodes n1 to n4, output signals OUT from the shift register SR1 and output signals BOUT from the buffer BUF corresponding to the shift register SR1. The output signals OUT from the shift register SR1 are obtained by shifting the phase of the input signals IN. Incidentally, the other shift register SR operate according to the timing chart shown in FIG. 4 in common with the shift register SR1.

As shown in FIG. 4, the low-level power supply voltage and the low-level voltage for the various types of signals such as the input signals IN, the clock signals CK1 to CK3 are set at VSS2, whose potential is higher than that of the low-level voltage VSS for the enable signals OE. This makes smaller an electric potential difference between the high-level voltage and the low-level voltage. As described later, the electric potential difference between the high-level voltage VDD and the low-level voltage VSS2 suffices if the electric potential difference turns on the ninth transistor T9. The electric potential difference does not have to be larger than that.

In a time period between time t1 and time t2, the electric potential of the input signals IN changes from the high-level voltage VDD to the low-level voltage VSS2, thus turning on the third transistor T3 and the fourth transistor T4. The second clock signal CK2 is at the high-level voltage, and accordingly the fifth transistor T5 is in an off-state. The high-level power supply voltage is supplied to the node n2 through the fourth transistor T4, thus raising the electric potential of the node n2 to the high level. This turns off the second transistor T2 and the sixth transistor T6.

The third transistor T3 is on, and the sixth transistor T6 is off. Accordingly, the input signals IN at the low-level voltage are supplied to the node n1 through the third transistor T3, thus lowering the electric potential of the node n1 to VSS2. This turns on the first transistor T1. As a consequence, the first clock signal CK1 at the high-level voltage is supplied to the output terminal 44 of the shift register through the first transistor T1. This maintains the output signals OUT from the shift register at the high-level voltage.

In a time period between time t2 and time t3, the electric potential of the input signals IN changes from the low-level voltage VSS2 to the high-level voltage VDD, and concurrently the electric potential of the first clock signal CK1 is reversed from the high-level voltage VDD to the low-level voltage VSS2. The rise of the electric potential of the input signals IN to the high level turns off the third transistor T3 and the sixth transistor T6, thus turning the node n1 to a floating state which does not apply electric voltage to the node n1. In addition, the node n1 is influenced by the reversal of the electric potential of the first clock signal CK1 to the low level through the transistor T1, thus lowering the electric potential of the node n1 to a low electric potential (an LL level), which is lower than the low-level voltage VSS2.

This is because the existence of parasitic capacity between the gate and the source of the first transistor T1 or between the gate and the drain of the first transistor T1 changes the electric potential of the node 1 in conjunction with change in electric potential between the drain and the source of the first transistor T1 in a case where the node n1 is in the floating state. Bootstrap is a term for the phenomenon of fluctuation in electric potential of the node in the floating state under influence of fluctuation in electric potential in a transistor to which the node is connected. In addition, bootstrap node is a term for the node in this case. Here, the decrease of the electric potential of the node n1 to the further lower level turns the first transistor T1 to an on-state securely. This causes the output terminal 44 of the shift register to be supplied with the first clock signal CK1 at the low-level voltage through the first transistor T1, thus turning the output signals OUT to the low-level voltage VSS2.

Furthermore, the second clock signal CK2 is at the high-level voltage. For this reason, the fifth transistor T5 is in an off-state, and the fourth transistor T4 is also in an off-state. Accordingly, the node n2 is supplied with no voltage, and is in a floating state. As a consequence, the parasitic capacity maintains the node n2 at the high-level voltage. In other words, in this time period, the node n1 is at the LL level while being in the floating state, and the node n2 is at the high-level voltage VDD while being in the floating state.

If the widths of the channels respectively of the first transistor T1 and the second transistor T2 are beforehand set larger than the width of the channels respectively of the other transistors with the aforementioned case taken into consideration, this causes the parasitic capacities of the first transistor and the second transistor to be larger. Accordingly, the nodes n1 and n2 can maintain the LL-level electric potential and the high-level potential respectively.

At time t3, the electric potential of the first clock signal CK1 rises to the high-level voltage VDD, the electric potential of the second clock signal CK2 decreases to the low-level voltage VSS2. The decrease of the electric potential of the second clock signal CK2 to the low-level voltage turns on the fifth transistor T5. At this time, the fourth transistor T4 is in an off-state. For this reason, the electric potential of the node n2 changes to the low-level voltage VSS2 through the fifth transistor T5. As a consequence, the second transistor T2 and the sixth transistor T6 are turned on. Turning on the sixth transistor T6 raises the node n1 to the high-level voltage, and turns off the first transistor T1. Turning off the first transistor T1 and turning on the second transistor T2 in this manner causes the output terminal 44 to be supplied with the high-level power supply voltage VDD through the second transistor T2, thus raising the electric potential of the output signals OUT from the shift transistor to the high level.

After time t3, the electric potential of the output signals OUT from the shift register rises to the high-level voltage VDD. Thus, the electric potentials respectively of the nodes n3 and n4 are reversed, the electric potential of the node n3 decreases to the low-level voltage VSS2, and the electric potential of the node n4 rises to the high-level voltage VDD. As a consequence, the ninth and the tenth transistors T9 and T10 are turned off and on respectively. Accordingly, through the tenth transistor T10, the buffer is supplied with the power supply voltage VDD. Hence, the electric potential of the output signals BOUT is maintained at the high-level voltage, no matter what electric potential the enable signals OE may be at. For the reference, the output signals OUT and the output signals BOUT are shown in an overlapping manner in FIG. 5.

Next, descriptions will be provided for operations of the buffers BUF. As shown in FIG. 4, the high-level voltage and the low-level voltage of the enable signals OE are respectively VDD and VSS. This voltage VSS is a voltage lower than the aforementioned low-level voltage VSS2.

In a time period between time t2 and time ta, when the output signals OUT from the shift register at the low-level voltage VSS2 is inputted into the buffer BUF, the electric potential of the node n3 turns to the high-level voltage VDD, since the seventh and the eighth transistors T7 and T8 constitute the inverter circuit. This turns off the tenth transistor T10. Furthermore, the output signals OUT at the low-level voltage, which are supplied from the shift register through the eleventh transistor T11, turns the node n4 to the low-level voltage VSS2, thus turning on the ninth transistor T9. The enable signals GE at the high-level voltage are supplied to the output terminal 49 of the buffer BUF through the ninth transistor T9, accordingly maintaining the output signals BOUT at the high-level voltage VDD.

In a time period between time ta and time tb, the electric potential of the enable signals OE decreases to the low-level voltage VSS, thus causing the bootstrap to operate. Accordingly, the electric potential of the node N4 in a floating state decreases to a level which is lower than VSS2 by a voltage equivalent to (VDD-VSS), thus maintaining the ninth transistor T9 in an on-state. Thereby, the electric potential of the output signals BOUT decreases to the low-level voltage VSS in conjunction with change in voltage of the enable signals OE.

In a time period between time tb and time t3, the electric potential of the enable signals OE rises to the high-level voltage VDD, thus returning the electric potential of the node n4 to the normal low-level voltage VSS2. Thus, the ninth transistor T9 is maintained in an on-state, and the electric potential of the output signals BOUT returns to the high-level voltage in conjunction with change in voltage of the enable signals OE.

After time t3, the electric potential of the output signals OUT from the shift resistor rises to the high-level voltage VDD. Thus, the electric potentials respectively of the nodes n3 and n4 are reversed, the electric potential of the node n3 decreases to the low-level voltage VSS2, and the electric potential of the node n4 rises to the high-level voltage VDD. As a consequence, the ninth and the tenth transistors T9 and T10 are turned off and on respectively. Accordingly, through the tenth transistor T10, the buffer is supplied with the power supply voltage VDD. Hence, the electric potential of the output signals BOUT is maintained at the high-level voltage, no matter what electric potential the enable signals OE may be at. For the reference, the output signals OUT and the output signals BOUT are shown in an overlapping manner in FIG. 5.

Figure 5:
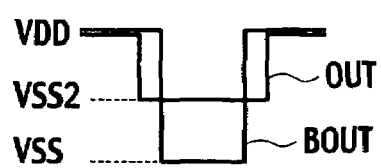
FIG. 5 shows diagram of output signals from the shift registers and output signals from the buffer in an overlapping manner.

In the case of this driver circuit, as shown in FIG. 5, the output signals OUT from the shift register are signals at a voltage level in a range of VSS2 to VDD, while the output signals BOUT are signals at a voltage level in a range of VSS to VDD, whose electric potential difference is larger than that between VSS2 and VDD. This causes the buffer circuits to amplify the signals. That is because the electric potential difference between the high-level power supply voltage VDD and the low-level power supply voltage VSS2 for the shift registers SR and the buffers BUF is set smaller than the electric potential difference between the high-level power supply voltage VDD and the low-level power supply voltage VSS for the enable signals OE. For example, all the parts of the shift registers and the parts other than the output circuit in each of the buffers are designed to operate at 18V, and the output circuit of each of the buffers is designed to operate at 22.5V.

In other words, the driver circuits in this display device can write the video signals into the pixels stably, since the buffers BUF can output the output signals BOUT with a larger electric potential difference between the high-level voltage and the low-level voltage. As far as the insides respectively of the shift registers SR and the buffers BUF are concerned, the circuits other than the output circuits of the buffers BUF are designed to operate by use of the high-level voltage and the low-level voltage, between which the electric potential difference is smaller. This makes it possible to reduce the voltage stress on each of the transistors, accordingly enabling the driver circuits to operate with higher reliability. In addition, the driver circuits are caused to operate at a lower voltage, thus enabling the power consumption to be reduced to a lower level.

Figure 6:
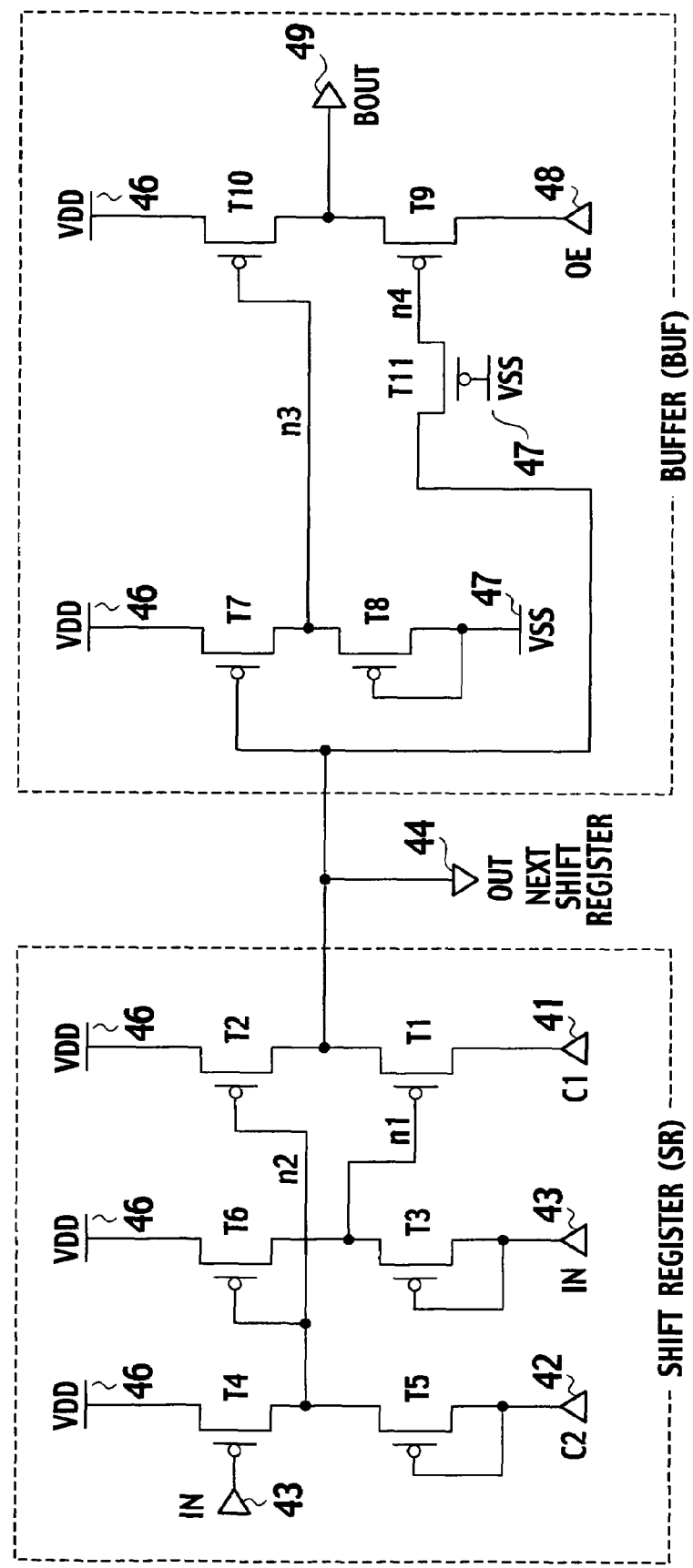
FIG. 6 shows a circuit diagram of a shift register and a buffer in a driver circuit as a comparative example.

Next, descriptions will be provided for a driver circuit as a comparative example. FIG. 6 is a circuit diagram showing configurations respectively of a shift register and a buffer on the driver circuit as the comparative example. In this comparative example, the low-level voltage of the various types of signals as well as the low-level power supply voltage in the shift registers and the buffers in addition to the low-level voltage of the enable signals OE are set at the single VSS. The other basic configurations respectively of the shift register and the buffer are the same as those of the circuits show in FIG. 3.

Figure 7:
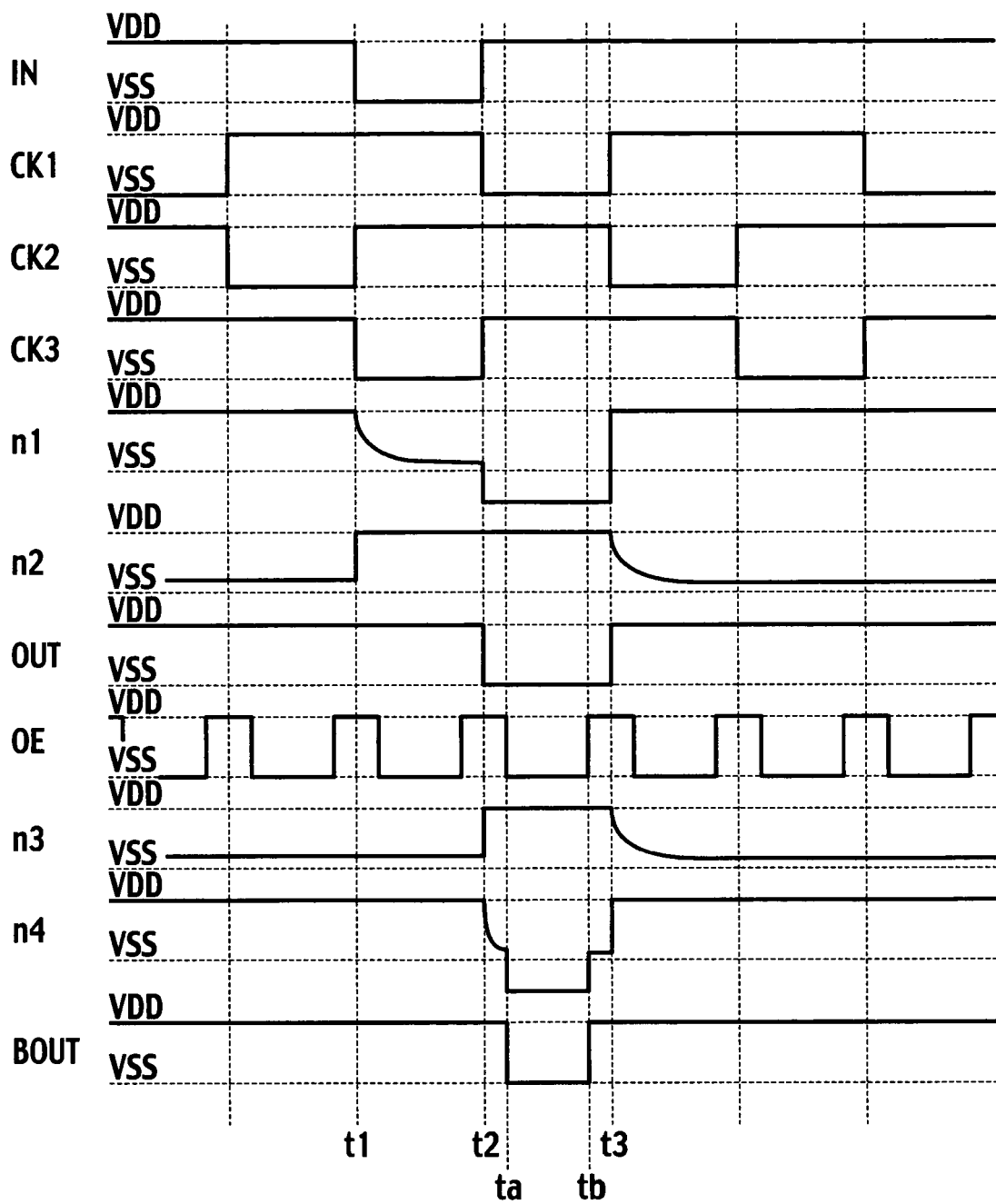
FIG. 7 shows a timing chart of the driver circuit as the comparative example.
Figure 8:
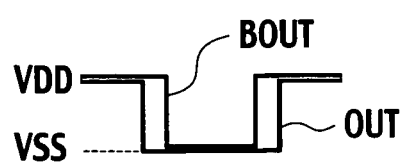
FIG. 8 shows a diagram of output signals from the shift register and output signals from the buffer in the comparative example in an overlapping manner.

FIG. 7 is a timing chart showing operations of the driver circuit in the comparative example. The driver circuit in the comparative example basically operates as shown by the timing chart of FIG. 4. However, all of the various types of signals are signals at VDD and VSS, between which the electric potential difference is larger. For this reason, an electric potential difference applied to the output signals BOUT is larger, thus enabling video signals to be written onto each of the pixels stably. On the other hand, the insides of a shift register and a buffer are supplied with the high-level voltage and the low-level voltage, between which the electric potential difference is larger. This causes the voltage stress on each of the transistors to be higher, thus reducing reliability in operations of the driver circuit. In addition, the driver circuit is operated at a higher voltage, thus consuming much more electric power. For the reference, the output signals OUT and the output signals BOUT are shown in overlapping manner in FIG. 8.

In contrast to this, in the case of the driver circuit according to this embodiment, the voltage stress on each of the transistors is lower, thus making higher the reliability in operations of the driver circuit. In addition, the driving of the driver circuit at the low-level voltage prevents an increase in the power consumption.

Consequently, according to this embodiment, the electric potential difference between the high-level power supply voltage and the low-level power supply voltage in the shift registers and the buffers is set smaller than the electric potential difference between the high-level voltage and the low-level voltage of enable signals OE, which the buffers use in their respective output circuits. This makes larger the electric potential difference between the high-level voltage and the low-level voltage of output signals BOUT, which output signals are amplified by use of enable signals OE. Accordingly, video signals can be written into each of the pixels stably. Furthermore, as far as the insides respectively of the shift registers and the buffers are concerned, all of the circuits, except for the output circuits of the buffers, operate by use of the high-level voltage VDD and the low-level voltage VSS2, between which the electric potential difference is smaller. This makes it possible to reduce the voltage stress on each of the transistors, accordingly enabling the operational reliability to be improved and concurrently power consumption to be reduced.

The configuration of the shift registers is not limited to the configuration shown in FIG. 3. No matter what configuration may be used for the shift registers, if the configuration enables phases of input signals to be shifted.

Furthermore, the configuration of the buffers is not limited to the configuration shown in FIG. 3. No matter what configuration may be used for the buffers, if the configuration makes it possible to amplify amplitudes of output signals OUT from the shift registers by use of enable signals OE. In this case, the electric potential difference between the high-level power supply voltage and the low-level power supply voltage of the shift registers and buffers is set smaller than the electric potential difference between the high-level voltage and the low-level voltage in the enable signals OE. Incidentally, it is desirable that the output circuits respectively of the buffers are configured to include the ninth transistor T9 and the tenth transistor T10, and that the output circuits are configured to output the output signals BOUT by use of the bootstrap by the ninth transistor T9.

Figure 9:
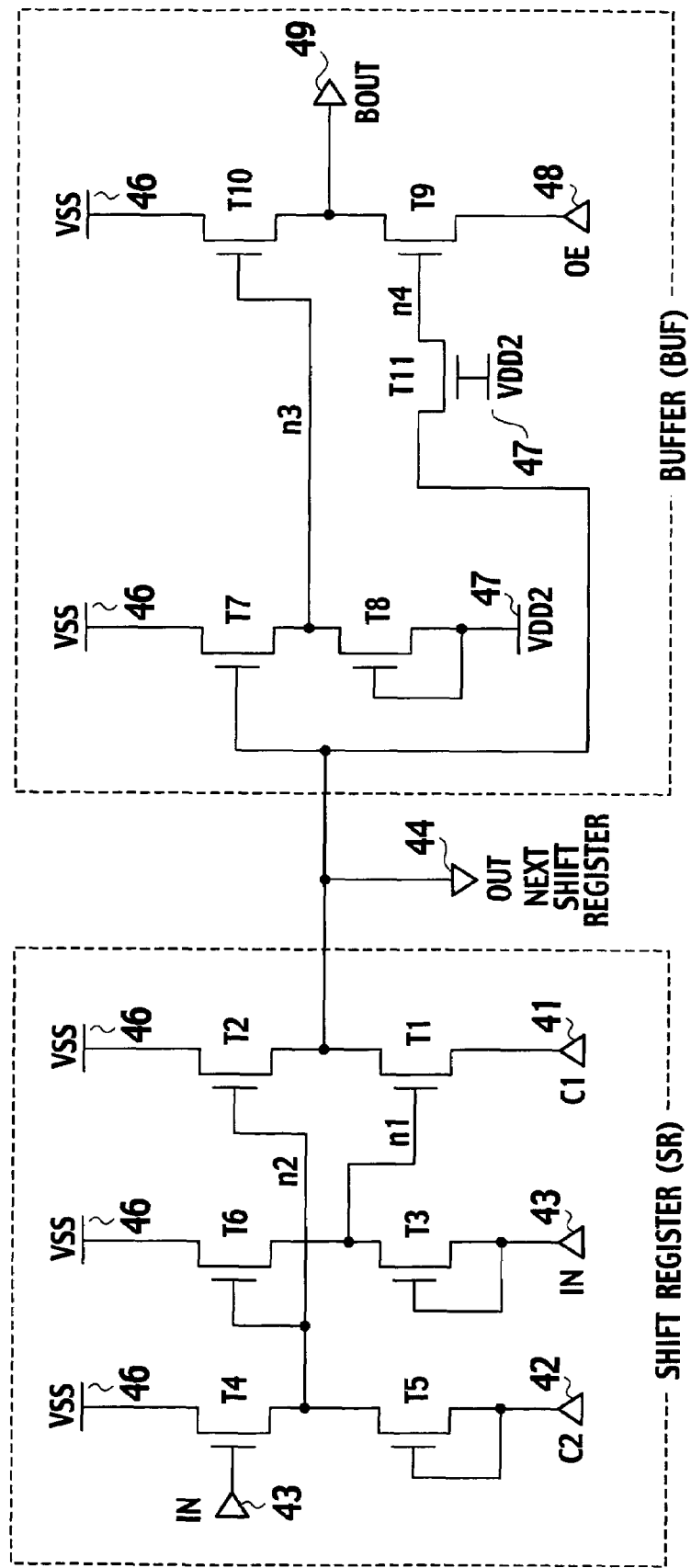
FIG. 9 shows a circuit diagram of other configurations respectively of the shift register and the buffer in the driver circuit.

Finally, in the case of this embodiment, the driver circuit has been described, in which pMOS transistors are used for the shift registers and the buffers, and which start pulse signals STP with pulses in the downward direction are transmitted. However, the driver circuit is not limited to this. As shown in FIG. 9, for example, the shift registers and the buffers may be configured of nMOS transistors, in association with which the driver circuits are configured to transmit start pulse signals with pulses in the upward direction. This case can bring about the same effect as the aforementioned case brings about.

What is claimed is:

1. A driver circuit in a display device, comprising:
  shift registers to shift phases of input signals to be inputted thereinto, and for thereafter outputting the phase-shifted signals; and
  buffers to amplify amplitudes of output signals from the shift registers by use of enable signals, and for thereafter outputting the amplified signals to scan lines or signals lines, wherein an electric potential difference between high-level voltage and low-level voltage of the enable signals is used as an electric potential difference with which to drive the scan lines or the signal lines, and an electric potential difference between high-level power supply voltage and low-level power supply voltage in the shift registers and the buffers is set smaller than the electric potential difference between the high-level voltage and the low-level voltage of the enable signals.

2. The driver circuit in the display device according to claim 1, wherein each of the buffers comprises an output circuit, the output circuit including:
- a transistor having a conductive path between an enable terminal into which to input the enable signals and an output terminal from which to output the amplified signals; and
- a transistor having a conductive path between the output terminal and the power supply voltage.

3. The driver circuit in the display device according to claim 1,
wherein each of transistors constituting the shift registers and the buffers is a pMOS transistor, and
the low-level power supply voltage in the shift registers and the buffers is set higher than the low-level voltage of the enable signals.

4. The driver circuit in the display device according to claim 1, wherein each of transistors constituting the shift registers and the buffers is an NMOS transistor, and
the high-level power supply voltage in the shift registers and the buffers is set lower than the high-level voltage of the enable signals.

* * * * *